United States Patent [19]

Chen et al.

[11] Patent Number: 5,567,512
[45] Date of Patent: Oct. 22, 1996

[54] THIN CARBON OVERCOAT AND METHOD OF ITS MAKING

[75] Inventors: Ga-Lane Chen, Fremont; Hoa Do, Union City, both of Calif.

[73] Assignee: HMT Technology Corporation, Fremont, Calif.

[21] Appl. No.: 134,216

[22] Filed: Oct. 8, 1993

[51] Int. Cl.⁶ .............................. G11B 5/66; B32B 5/16; B32B 9/00; C23C 14/00

[52] U.S. Cl. .......................... 428/332; 428/336; 428/408; 428/694 T; 428/694 TR; 428/694 TP; 428/694 TC; 428/694 TZ; 428/694 TF; 428/698; 428/900; 204/192.2

[58] Field of Search .................... 428/694 T, 694 TP, 428/694 TC, 694 TZ, 694 TF, 694 TR, 900, 332, 336, 408, 698; 204/192.2

[56] References Cited

U.S. PATENT DOCUMENTS

| | | | |
|---|---|---|---|
| 4,717,622 | 1/1988 | Kurokawa | 428/408 |
| 4,767,517 | 8/1988 | Hiroki | 204/192.25 |
| 4,780,354 | 10/1988 | Nakayama | 428/141 |
| 4,804,590 | 2/1989 | Nakamura | 428/408 |
| 4,932,331 | 6/1990 | Kurihara | 106/286.1 |
| 5,045,165 | 9/1991 | Yamashita | 204/192.16 |
| 5,227,211 | 7/1993 | Eltoukhy | 428/65.4 |
| 5,260,409 | 11/1993 | Schmidt | 428/446 |

OTHER PUBLICATIONS

Marchon, B., et al., "Raman and resistivity investigations of carbon overcoats of thin–film media: Correlations with tribological properties," *J. Appl. Phys.* 69(8): 5748–5750 (1991).

Marchon, B., et al., "Structure and Mechanical Properties of Hydrogenated Carbon Films Prepared by Magnetron Sputtering," *IEEE Trans. Mag.* 27(6): 5160–5162 (1991).

*Primary Examiner*—Leszek Kiliman
*Attorney, Agent, or Firm*—Peter J. Dehlinger; Judy M. Mohr

[57] ABSTRACT

A thin film magnetic disc having a carbon overcoat which is characterized by (i) a surface density of nitrogen atoms between $3-8 \times 10^{16}$ atoms/cm$^2$, as determined by Rutherford backscatter spectroscopy, and (ii) an erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere. The overcoat has a preferred thickness between 80–150 Å. Also disclosed is a method of producing a thin, wear-resistant carbon overcoat.

5 Claims, 8 Drawing Sheets

THIN CARBON OVERCOAT AND METHOD OF ITS MAKING

1. Field of the Invention

The present invention relates to a thin, wear-resistant carbon overcoat in a thin-film recording medium, and to a method of producing the overcoat.

2. References

Bird, J. R., et al., Ion Beams of Material Analysis, Academic Press.

Brundle, C. R., et al., Encyclopedia of Materials Characterization, Butterworth-Heinemann (1992).

Chu, W-K, et al., Backscattering Spectrometry, Academic Press (1978).

Marchon, B., et al., J. Appl. Phys., Vol 69, pp.5748–5750 (1991a).

Marchon, B., et al., IEEE Trans. Mag., Vol 22, pp. 5160–5162 (1991b).

3. Background of the Invention

Carbon overcoats are commonly formed on substrates, such as magnetic thin films, in thin-film recording discs. The overcoat functions to protect the underlying magnetic layer from damage and wear caused by repeated contact between the disc and the read-write head used in accessing the disc. For this reason, the carbon overcoat is ideally formed to have a high degree of hardness or erosion-resistance.

In addition, the graphite overcoat is intended to provide lubricating surface properties, to minimize drag on the head and wear on the disc during prolonged head/disc contact. The overcoat therefore ideally provides a low-friction surface. The lubricity of a hard carbon overcoat on a disc may be enhanced by covering the overcoat with a thin liquid layer of a stable fluid lubricant, such as a perfluoropolyether lubricant. The optimum friction reduction may be achieved with a liquid layer of perfluoropolyether of about 15–30 Å or higher.

Another method which has been used for producing a carbon overcoat involves carbon deposition by sputtering, typically DC magnetron sputtering, in which the ionized gases are directed onto the target by magnetic fields established in the sputtering device. Typically in this method, a graphite substrate is sputtered onto a thin-layer film substrate in a low-pressure argon atmosphere until an overcoat of the desired thickness is reached.

The resulting carbon overcoat has a predominantly graphitic structure with "islands" of diamond-like crystalline clusters with dimensions on the order of about 20 Å. It is, of course, the diamond-like clusters which impart the hardness properties to the overlayer. Typically, adequate wear resistance is achieved only at a thickness of between about 200–300 Å.

More recently, hydrogen-doped carbon films have been widely used in thin film discs. However, hydrogen-doped carbon overcoats tend to be sensitive to high humidity, giving high stiction. Also, existing both carbon and hydrogen-doped carbon films have poor mechanical strength as the film is reduced to 150 Å or less, leading to rapid wear. This thickness, by limiting the fly height of a magnetic head on the discs, creates a spacing loss that in turn limits the recording density of the disc.

4. Summary of the Invention

The present invention includes, in one embodiment, a thin-film medium having a substrate and a magnetic thin-film layer. The medium has a sputtered carbon overcoat on the layer that is characterized by:

(i) a surface density of nitrogen atoms between $3-8 \times 10^{16}$ atoms/cm$^2$, as determined by Rutherford backscatter spectroscopy, and (ii) an erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere.

In a preferred embodiment, the overcoat has a thickness between 80–150 Å, and the medium further includes a layer of perfluoropolyether lubricant on the overcoat.

In another aspect, the invention includes a thin-film medium having a substrate, a magnetic thin-film layer, and a carbon overcoat on the layer which is formed by sputtering from a graphite target under an atmosphere composed of 60–80 atomic percent argon and 20–40 atomic percent nitrogen.

The overcoat has a preferred thickness between 80–150 Å, and a preferred erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere.

Also included in the invention is a method of achieving a severalfold decrease in the erosion rate of a sputtered carbon overcoat, as measured by an $Al_2O_3$ particle tape placed in contact with the medium, over the rate of erosion of an overcoat formed by sputtering the overcoat under a pure argon atmosphere. The method includes depositing the overcoat by sputtering from a graphite target under an atmosphere composed of 60–80 atomic percent argon and 20–40 atomic percent nitrogen.

These and other objects and features of the invention will become more fully apparent when the following detailed description of the invention is read in conjunction with the accompanying drawings.

DETAILED DESCRIPTION OF THE INVENTION

I. Carbon Overcoat and Preparation

Figure 1:
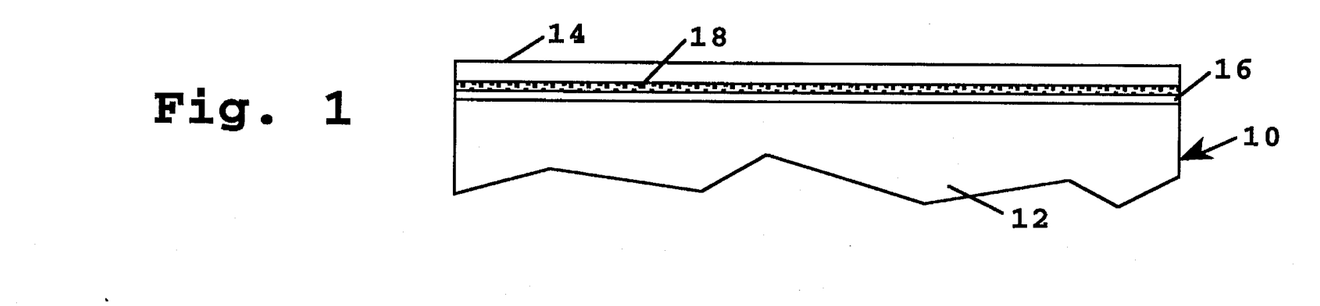
FIG. 1 is a sectional view of a thin-film magnetic disc having a carbon overcoat formed in accordance with the present invention.

FIG. 1 shows in cross section view, a fragmentary portion of a thin-film medium 10 composed of a rigid disk-like substrate 12, and forming successive thin-film layers over the substrate, a crystalline underlayer 16, a magnetic thin-film layer 18, and an overcoat 14 formed in accordance with the invention.

The substrate may be a textured substrate, such as a conventional surface-coated, textured aluminum substrate of the type used commonly for digital recording medium, or a textured glass or ceramic substrate, such as described in co-owned patent application for "Glass Substrate with Controlled Low-Friction Surface", Ser. No. 475,715, filed Feb. 20, 1990.

The crystalline underlayer is preferably a sputtered chromium underlayer having a thickness between about 300–3,000 Å. The magnetic film layer is preferably a cobalt-based alloy which is formed on the underlayer by sputtering or the like. Exemplary thin-film alloys include Co/Cr/Ni, or Co/Cr/Ta/Pt, such as described in co-pending U.S. patent application for "High Coercivity Thin-Film Medium and Method", Ser. No. 567,598, filed Aug. 15, 1990. The just-cited application also discloses suitable sputtering conditions for forming the underlayer and thin-film layer.

Figure 2:
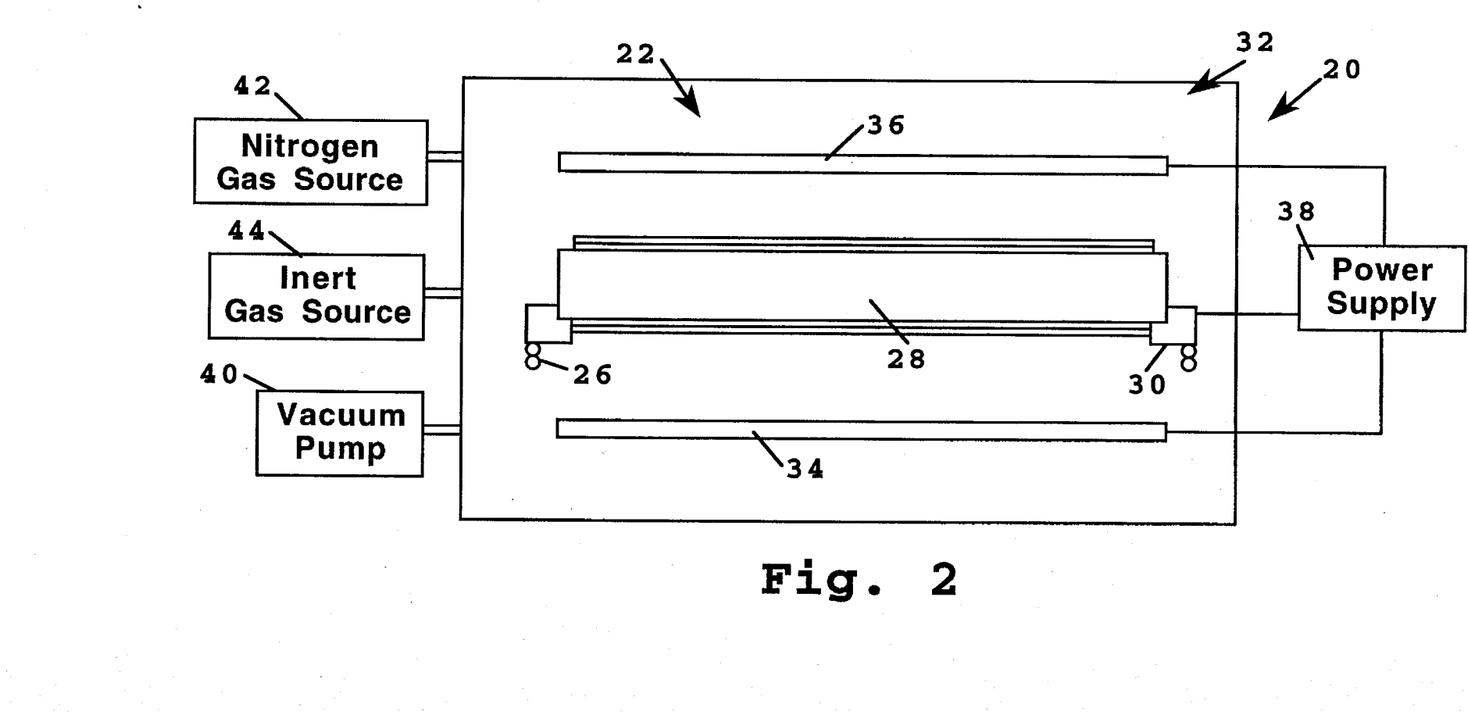
FIG. 2 is a schematic view of sputtering apparatus used in producing the disc shown in FIG. 1.

FIG. 2 shows, in schematic cross-sectional view, a portion of a sputtering apparatus 20 for use in forming the above thin-film medium, including the carbon overcoat. The apparatus includes a vacuum chamber 22 having at least four stations at which heating or sputtering operations occur. Within this chamber is a pair of endless belts, such as belt 26, for carrying substrates, such as substrate 28, through the chamber. The substrates are supported on pallets, such as pallet 30, which is carried through the chamber on the endless belts.

In a sputtering operation, the substrate is carried on the pallet in a downstream direction, from an upstream heating station, through a first sputtering station in which the underlayer is formed, through a second sputtering station in which the thin-film is formed, and through a downstream station 32 in which the carbon overcoat is formed.

Station 32 houses a pair of carbon, i.e., graphite targets 34, 36. The targets are connected to a power supply 38 in the apparatus to achieve a selected target voltage with respect to the disc, as shown. Commercially available graphite targets, such as a POCO™ target supplied by POCO Graphite, Inc. (Decatur, Tex.) are suitable. The carbon sputtering voltage is typically adjustable between about 400 to 600 volts, giving a power level between about 0.8 and 4 kwatts.

The final pressure in the chamber during a sputtering operation is a selected pressure preferably between about $10^{-3}$ to $10^{-2}$ mBarr. The vacuum pressure is achieved with a conventional low-pressure vacuum pump 40.

A sputtering apparatus of the type just described is commercially available, such as from Circuits Processing Apparatus (Fremont, Calif.), Leybold Heraeus (Germany), Ulvac (Japan), VACTEK (Boulder, Colo.) or Materials Research Corp (Albany, N.Y.). These systems are all double-sided, in-line, high-throughput machines having two interlocking chambers for loading and unloading. Besides in-line sputtering machines, a sputtering system with static, single disk sputtering, such as Varian's (Intevac) MDP-series, could be used to produce the same disks.

In the embodiment of the invention shown in FIG. 1, the carbon overcoat is formed by sputtering under a low-pressure, nitrogen-containing atmosphere. In particular, the sputtering atmosphere contains between 20–40 atomic percent nitrogen gas, i.e., the atoms of $N_2$ introduced into the chamber represent between 20 and 40 atomic percent of the total gas molecules in the chamber. The low-pressure sputtering atmosphere also includes an inert sputtering gas, such as argon, at between 60–80 atomic percent.

The nitrogen and argon gases are supplied to the chamber from gas sources, such as a nitrogen gas source 42, and an argon gas source 44. The desired atomic percentages of gases in the chamber may be controlled by suitable valving apparatus (not shown) which control the flow rate at which gases are introduced into the chamber. Alternatively, the desired gas may be premixed and admitted to the sputtering chamber from a single mixed-gas source.

In the application of the invention to thin-film media, the carbon overcoat is preferably formed under sputtering conditions which yield a final overcoat thickness of less than about 200 Å, and preferably between about 80–150 Å. According to an important feature of the invention, it has been discovered that a thin carbon overcoat formed by sputtering under 20–40 atomic percent $N_2$ has resistance-to-erosion properties previously attained only in relatively thick carbon films, e.g., films having thicknesses greater than 200–300 Å.

After formation of the overcoat, the disc is preferably coated with a conventional perfluoropolyether lubricant, such as AM 2001™ or Z-Dol™ lubricant supplied commercially by Ausimont (Morristown, N.J.). The fluid may be applied conventionally by an endless belt tape device designed to burnish and lubricate a finished disc surface. Alternatively, the finished disc may be dipped in a solution of the lubricant in a suitable solvent. According to the present invention, such lubricant has an enhanced adhesion to the carbon overcoat, forming a durable lubricant film on the overcoat. The greater adhesion characteristics of the overcoat will be seen below.

II. Carbon Overcoat Properties

Raman Apectra Analysis

Raman spectroscopy with inelastic light scattering by photons is a useful tool for characterizing carbon films. In an amorphous thin film material, Raman spectroscopy measures a weighted photon density of states, which reflects changes in bonding and ordering.

Experimentally, laser light with 20 mW was incident at 65° from the normal of disk surface with 15 μm spot size. The dispersed light was detected by a microchannel plate photomultiplier (1024×1024). The spectra were obtained with the 48 mm line (2.54 eV) by argon laser. The Raman spectra of a—C, a—C:H, and nitrogen-doped carbon (NDC) films consists of two broad and overlapped Gaussian peaks, i.e. G-Band and D-band. The G-band is near 1570 $cm^{-1}$ and the D-band is near 1370 $cm^{-1}$. It has been shown that the position of G-band and the ratio of D-band to the G-band ($l_D/l_G$) are highly correlated with the mechanical properties of the hydrogenated carbon films (Marchon, 1991a and 1991b).

Figure 3A:
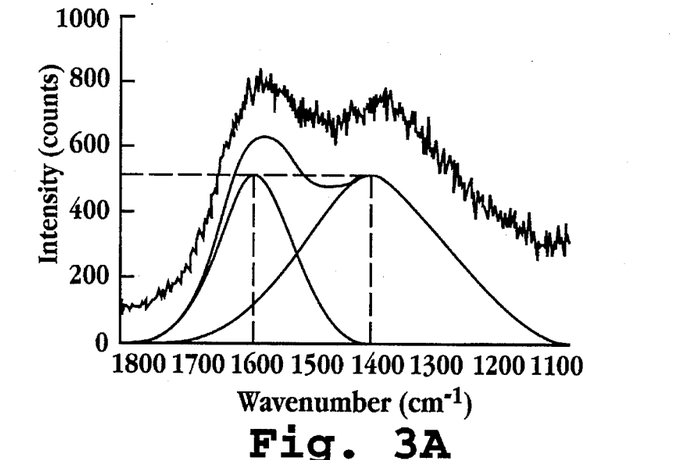
FIGS. 3A–3E are Raman spectra of carbon films formed by sputtering in the presence of 100% argon (FIG. 3A), and argon containing 10% $N_2$ (FIG. 2B), 20% $N_2$ (FIG. 3C), 30% $N_2$ (FIG. 3D), and 40% $N_2$ (FIG. 3E)
Figure 3B:
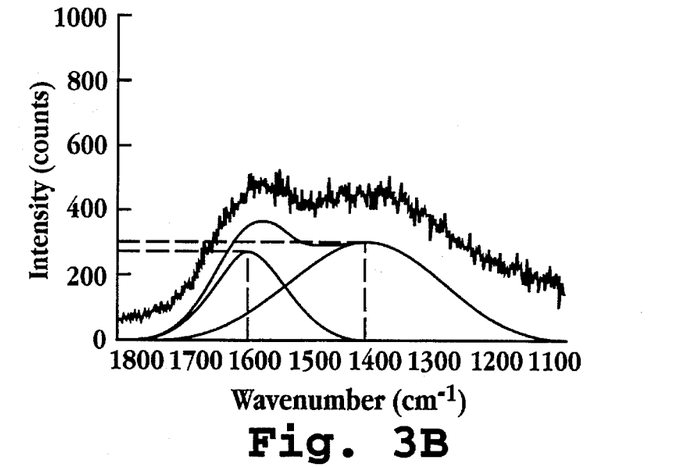
Figure 3C:
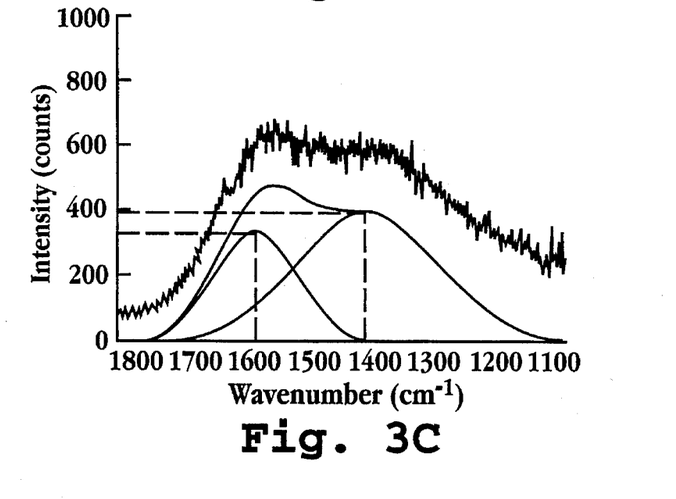
Figure 3D:
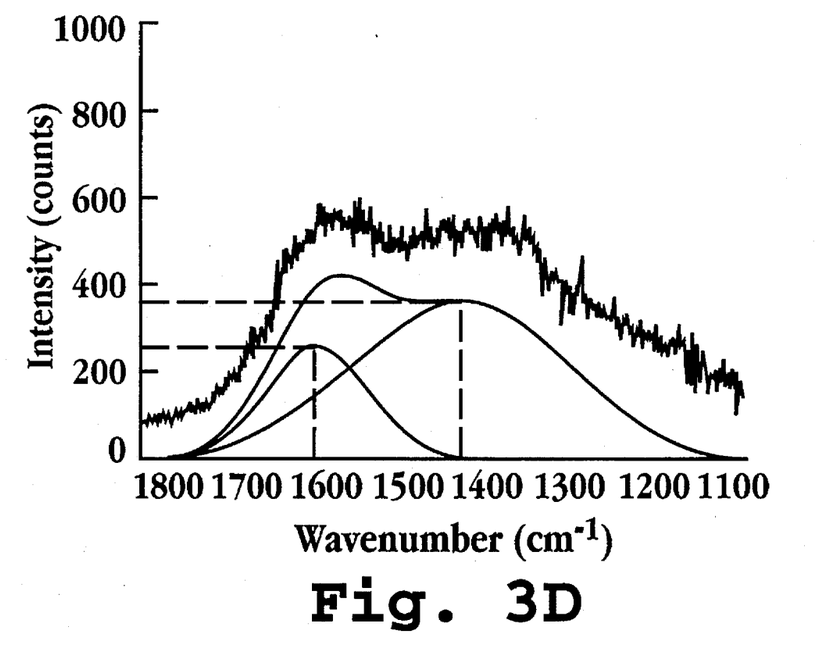
Figure 3E:
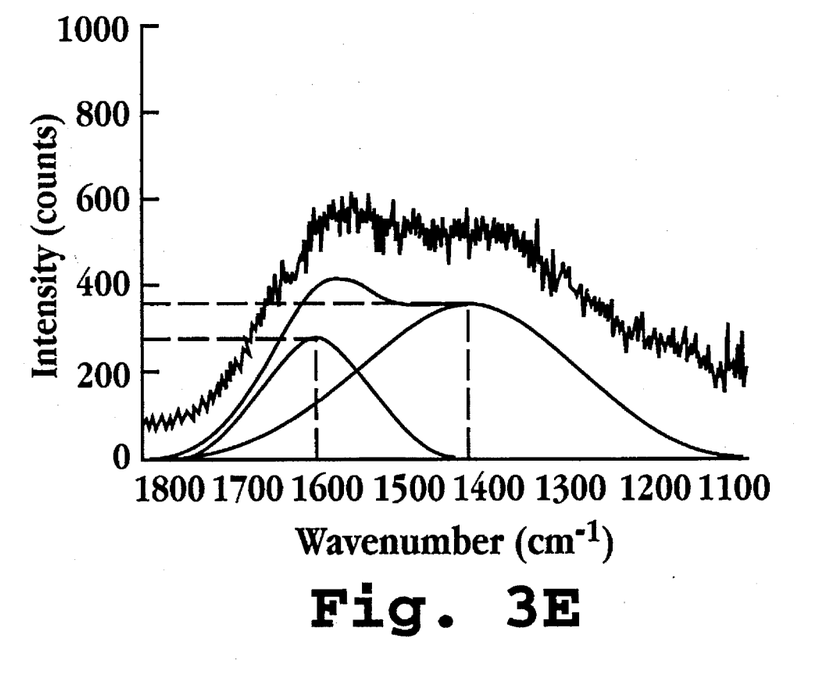

FIGS. 3A–3E show the Raman spectra of carbon films formed by sputtering in the presence of 100% argon (FIG. 3A), and argon containing 10% $N_2$ (FIG. 3B), 20% $N_2$ (FIG. 3C), 30% $N_2$ (FIG. 3D), and 40% $N_2$ (FIG. 3E). Apparent from the figures are (i) the decreasing G-band frequency with increasing amounts of nitrogen and the increasing D-band frequency with increasing nitrogen.

Table 1 below shows the D-band shifts, G-band shifts, and the ratio $I_d/I_g$ of the D- and G-band intensities, with increasing amounts of nitrogen from 0 to 75 atomic percent. Highest $I_d/I_g$ ratios were observed for NDC films formed between 20–40 atomic percent $N_2$. Highest $I_d/I_g$ ratios (which correlate with mechanical properties) are observed for films formed under 20–40 atomic percent $N_2$.

TABLE 1

| $N_2$ Content (%) | Id/Ig | d-shift (cm$^{-1}$) | g-shift (cm$^{-1}$) |
|---|---|---|---|
| 0 | 1.38211 | 1392.42 | 1588.09 |
| 20 | 1.64745 | 1390.29 | 1572.91 |
| 40 | 1.7021 | 1392.49 | 1571.11 |
| 60 | 1.58109 | 1395.19 | 1571.39 |
| 75 | 1.4879 | 1393.69 | 1571.49 |

ESCA Analysis

Chemical analysis of the surface chemical groups on the overcoat provides information about the atomic composition of surface and the types of bonds formed by the surface atoms. The types of chemical bonds can be determined from the electron binding energy which is characteristic of bond type, such as C—C, C—O, C=O, or C—N. The relative amounts of atoms can be determined by the relative peak areas of the various emission peaks.

Figure 4A:
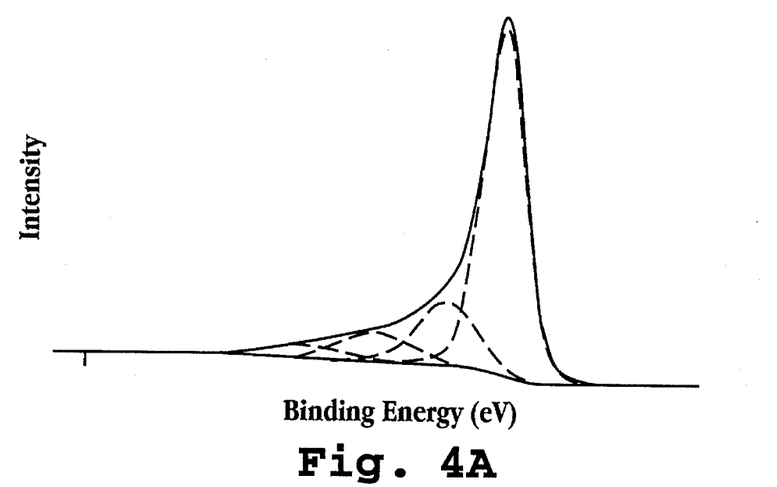
FIGS. 4A–4C are binding energy spectra for carbon films sputtered with 100% argon (FIG. 4A), 50% argon/50% $CH_4$ (FIG. 4B), and 80% argon/20% $N_2$ (FIG. 4C)
Figure 4B:
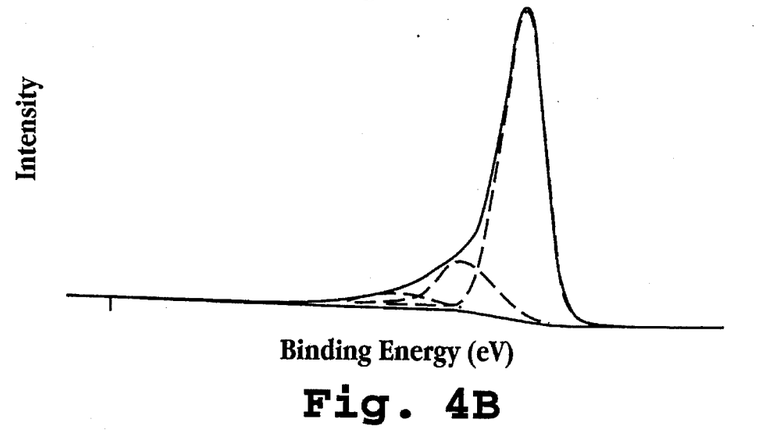
Figure 4C:
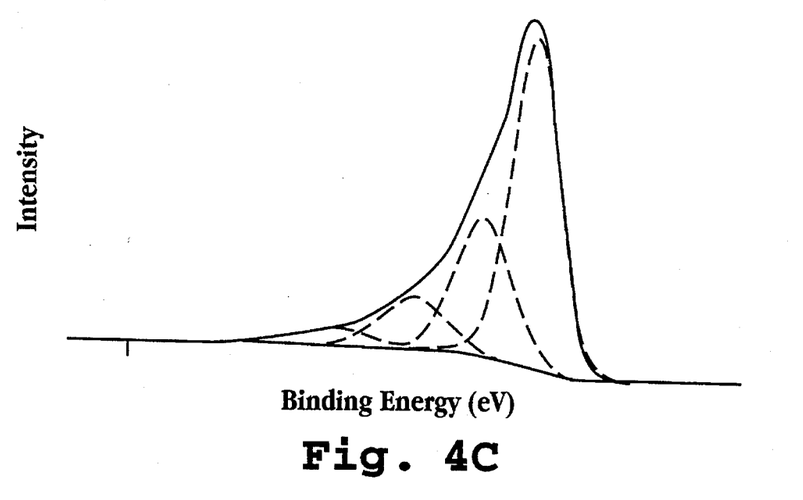

FIGS. 4A–4C show ESCA spectra for carbon overcoats formed under 100% argon (FIG. 4A), argon:methane, 1:1 (FIG. 4B) and argon:nitrogen, 8:2 (FIG. 4C) atmospheres, respectively. The spectra are taken over the spectral energy region from about 278–298 eV. The peaks are related to the 1 s carbon electrons in C—C (about 284 eV), C—O and C—N (about 286 eV), C=O (about 288 eV), and O—C=O (about 290 eV) chemical groups, as indicated. The relative proportions of each bond type in the three overcoats is shown in Table 2 below. As seen, the NDC film has a substantially lower percentage of C—C bonds, and greater percentage of C—O and C—N bonds than either of the other two films.

TABLE 2

| | Binding Energy Peak Profiles Position (eV) and Percentage (%) | | | | | | | |
|---|---|---|---|---|---|---|---|---|
| Carbon Type | C1 (eV) | % | C2 (eV) | % | C3 (eV) | % | C4 (eV) | % |
| a-C (100% Ar) | 284.51 | 69.5 | 286.01 | 17.0 | 287.94 | 8.9 | 290.04 | 4.5 |
| a-C:H (50% CH4) | 284.79 | 77.0 | 286.31 | 15.2 | 288.05 | 6.4 | 290.20 | 1.5 |
| NDC (20% N2) | 284.70 | 56.3 | 286.12 | 26.5 | 287.93 | 11.9 | 290.26 | 5.2 |

Figure 5:
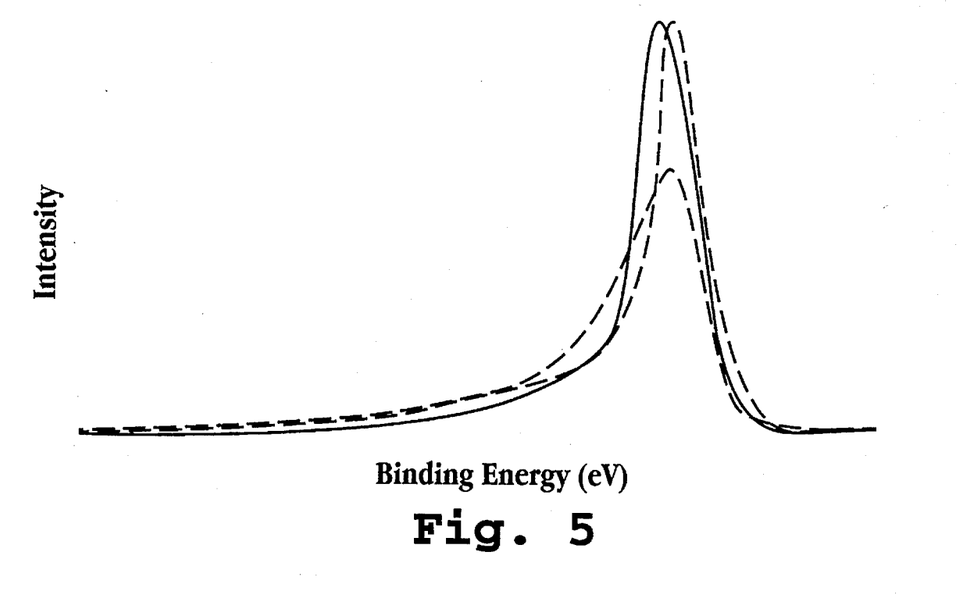
FIG. 5 shows superimposed ESCA spectra for three carbon films corresponding to 100% argon (dash-dot line), 50% argon/50% $CH_4$ (solid line), and 80% argon/20% $N_2$ (dash-double dot line)

FIG. 5 is the superimposed ESCA spectra for three different kinds of carbon. The profiles for carbon sputtered with pure argon is similar to that sputtered with gas mixture comprised of 50% argon/50% $CH_4$, except that hydrogenated carbon has a higher binding energy. The profile for a carbon overcoat sputtered with gas mixture of 80% argon/ 20% $N_2$ is quite different. It has lower percentage of C1 peak (56.3%) but higher percentage of C2, C3, and C4 peak intensities, reflecting the data in Table 2. The structure difference explains the better mechanical properties, particularly, higher wear resistance for nitrogen doped carbon films, as discussed below.

Surface Atom Densities

Rutherford Backscattering (RBS) and Elastic Recoiled Detection (ERD) were used to calculate surface atomic densities of carbon, hydrogen, and nitrogen, according to known procedures (Bird, Brindle, Chu). The studies were carried out on carbon films formed on a Canasite™ sample, in order to avoid overlapping of the signal due to Ni and other metals. The values of carbon and nitrogen were calculated from the simulated fitting to measured RBS spectra. The composition was determined for a carbon film formed by sputtering in an 80% argon/20% nitrogen atmosphere, to the film thicknesses indicated. Table 3 shows the actual measured atom density and, in parenthesis, the atom density normalized to a film thickness of 330 Å.

TABLE 3

| $N_2$ Content (%) | C(atoms/cm$^2$) | N(atoms/cm$^2$) | Thickness (Å) |
|---|---|---|---|
| 0 | $3.9 \times 10^{17}$ ($3.9 \times 10^{17}$) | $1.5 \times 10^{16}$ ($1.5 \times 10^{16}$) | 330 |
| 20 | $3.9 \times 10^{17}$ ($3.9 \times 10^{17}$) | $3.5 \times 10^{16}$ ($3.5 \times 10^{16}$) | 350 |
| 40 | $3.9 \times 10^{17}$ ($3.9 \times 10^{17}$) | $7.5 \times 10^{16}$ ($7.1 \times 10^{16}$) | 420 |
| 60 | $4.2 \times 10^{17}$ ($3.3 \times 10^{17}$) | $1.0 \times 10^{17}$ ($7.9 \times 10^{16}$) | 420 |
| 75 | $4.6 \times 10^{17}$ ($3.6 \times 10^{17}$) | $1.7 \times 10^{17}$ ($1.2 \times 10^{17}$) | 450 |

The data shows first that the surface density of nitrogen atoms in the film increases with increasing percent nitrogen gas used in forming the layer. In the range 20–40 atomic percent nitrogen, the surface density of nitrogen is about $3-8 \times 10^{16}$ atoms/cm$^3$, the preferred surface density of nitrogen atoms in the invention.

Resistance to Erosion

The resistance to erosion was measured by a Selket 100 erosion tester (San Jose, Calif.). The device has a 1 inch diameter steel ball which is applied to a tape roller (coated with aluminum oxide particles), to apply an erosion pressure on the roller. One preferred abrasive surface is a 0.3µ particle size abrasive tape, such as tape No. 511904569 supplied by 3M Corp. (Minneapolis, Minn.).

Figure 6:
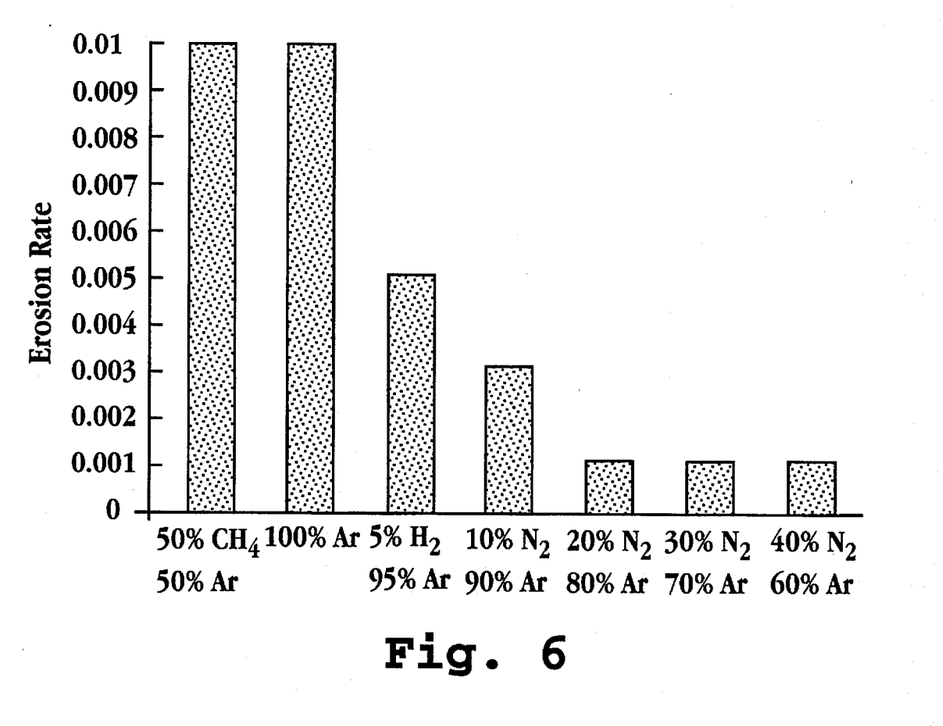
FIG. 6 is a bar graph showing the rate of erosion of a carbon overcoat formed by sputtering under a sputtering atmosphere having one of the compositions indicated in the plot.

Resistance to rate of erosion, expressed in mV of signal output related to changes in the reflectivity of the surface, was measured over a one minute time interval. Carbon films were prepared on a Ni/AL substrate to a final thickness of 300 Å under one of the following sputtering gas conditions: 50% $CH_4$/50% argon, 100% argon, 5% $H_2$/95% argon, 10% $N_2$/10% argon, 20% $N_2$/10% argon, 30% $N_2$/10% argon, and 40% $N_2$/10% argon. As seen from the wear resistance rates in FIG. 6, the best wear resistance was obtained for the films formed under 20–40 atomic percent nitrogen. The rate of erosion was several times lower than that achieved by conventional sputter deposition under a pure argon atmosphere, or an argon/methane atmosphere.

Contact Start-Stop Properties

CSS (contact-start-stop) testing is an important test for the hard disk drive performance. For advanced near-contact recording, the disks must have low stiction and friction at different humidity environments during the CSS test.

FIGS. 7A–7E shows the results of in-situ wet stiction/ friction tests for 95 mm disks with different carbon overcoat and thickness. In this test, we kept temperature at a constant 30° C. while the relative humidity (R.H.) was increased from 35% to 90% with 5% increment and then the humidity was stepped down to 35%. At each humidity step, there are 50 CSS cycles. Thin film heads with 6.5 gram load were used for testing on 95 mm disks at radius of 21.6 mm.

Figure 7A:
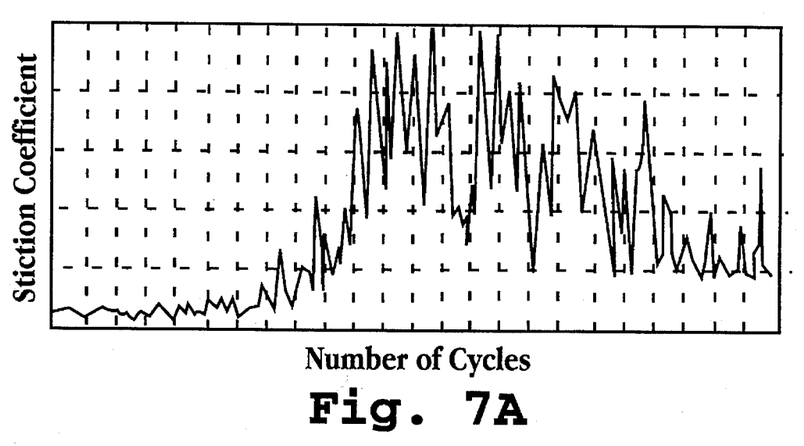
FIGS. 7A–7E show the results of in-situ wet stiction/friction test on carbon overcoats sputtered in the presence of 50% argon/50% $CH_4$ 250 Å (FIG. 7A), and 60% argon/40% $N_2$ for film thicknesses of 200 Å (FIG. 7B), 150 Å (FIG. 7C), 125 Å (FIG. 7D), and 100 Å (FIG. 7E)
Figure 7B:
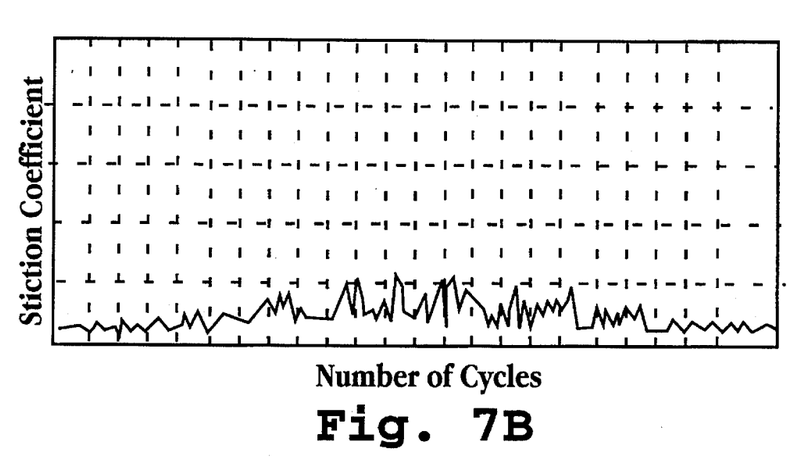
Figure 7C:
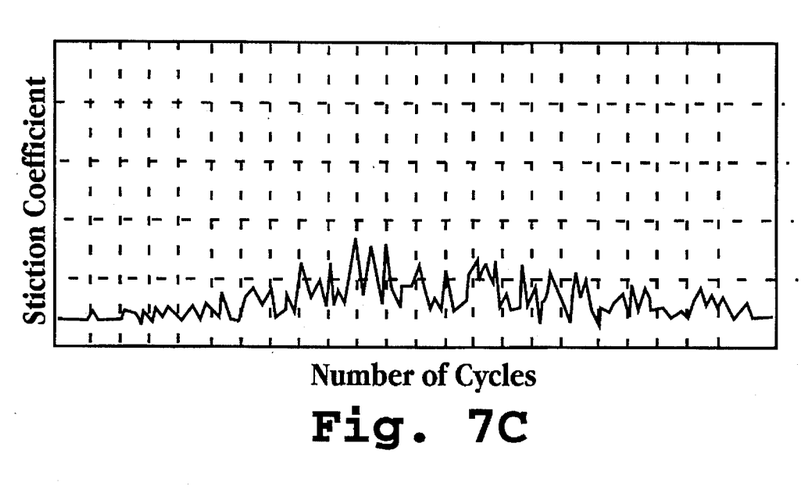
Figure 7D:
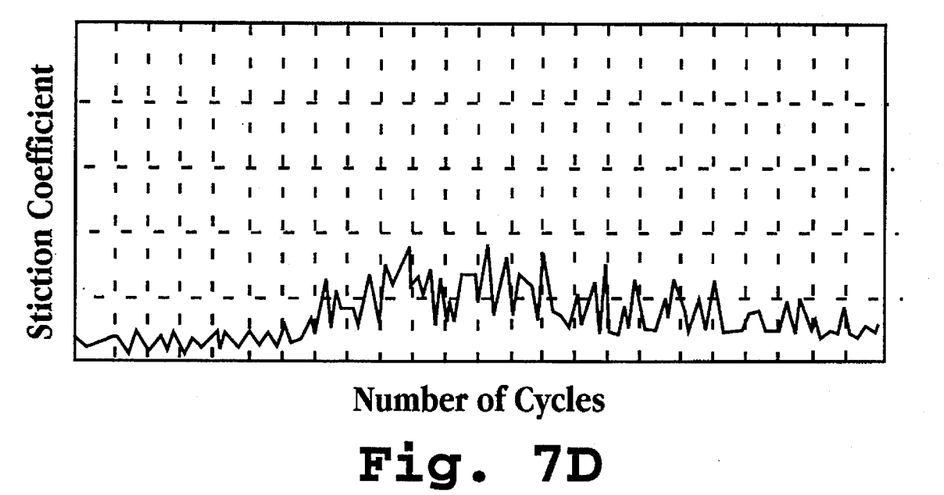
Figure 7E:
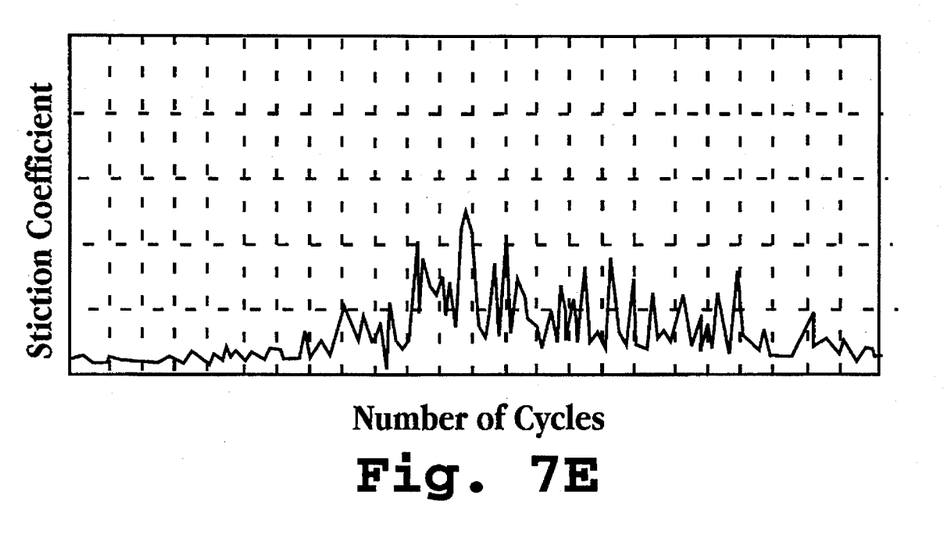

Hydrogenated carbon sputtered with 50% Ar+50% CH4 with thickness at 250 Å as shown in FIG. 7A. Nitrogen doped carbon (NDC) sputtered with 60% Ar+40% N2 with thickness from 200 Å, 150 Å, 125 Å to 100 Å are shown in FIG. 7B, 7C, 7D, and 7E, respectively. FIG. 7A indicates hydrogenated carbon has higher stiction and friction, and it is more sensitive to the wet humidity. FIGS. 7B–7E show that nitrogen doped carbon films have excellent CSS performance, even at thicknesses as thin as 100 Å.

Medium with Thin Carbon Film

In one aspect, the medium of the invention includes a nitrogen-doped carbon film having a thickness between about 80–150 Å. The reduced thickness, which is allowed by the greater wear resistance of the NDC film, enhances several recording characteristics of a thin-film medium.

The greater wear resistance of the carbon film of the invention allows the film thickness to be reduced substantially, preferably in the 80–150 Å range, while retaining good wear resistance. The reduced thickness, by allowing the head to fly closer to the magnetic film layer in a recording medium, improves media performance in several ways.

Figure 8A:
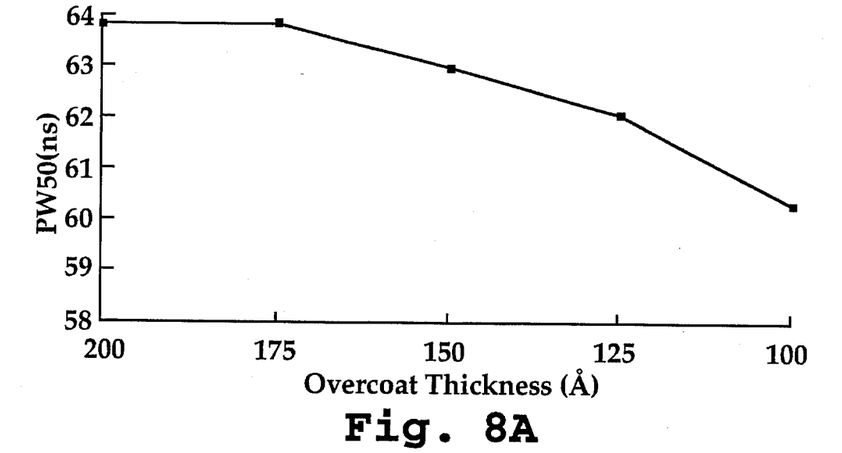
FIGS. 8A–8C are plots showing variation, as a function of carbon film thickness, $PW_{50}$ (FIG. 8A), overwrite (–dB) (FIG. 8B), and resolution (FIG. 8C).
Figure 8B:
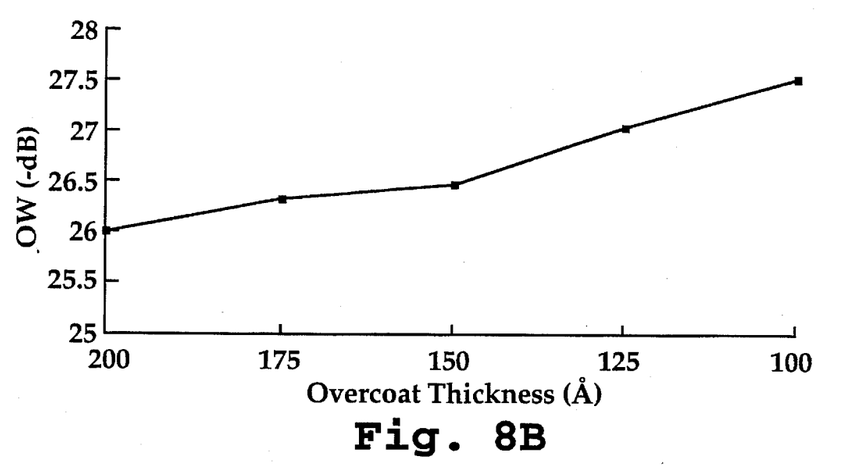
Figure 8C:
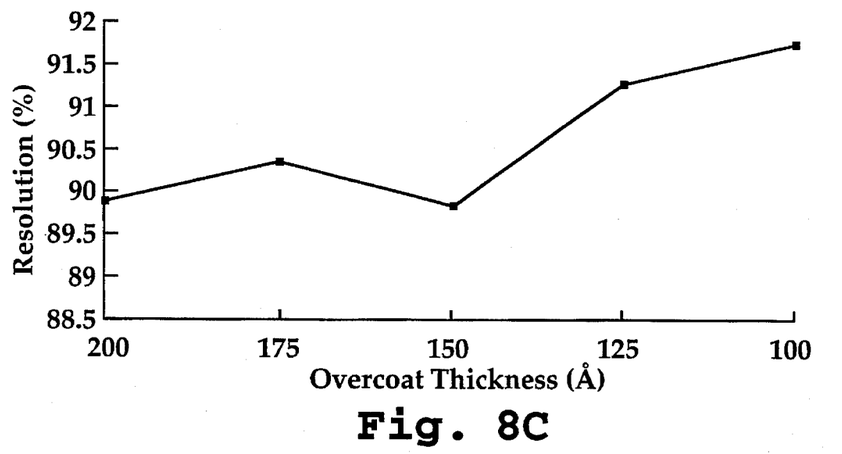

FIGS. 8A–8C show the improvement in various values in a thin-film medium formed on an aluminum with a Ni-phosphorus coated substrate, and having a Cr underlayer and Co/Cr/Ta (88:8:4) magnetic layer. The final carbon overlayer was formed by sputtering from a graphite target under an 80% argon/20% nitrogen atmosphere. Magnetic recording testing was carried out on a Guzik Model RWA 501, using a thin-film inductive reading and recording head with a gap length of 0.26 μm, and a flying height of 3.0 μin. The head inductance was 1.5 μHenry and resistance, 1 ohm/turn. Recording current was 12 mAmps for saturation. The Id measurements were made at 0.985 inches, at a recording frequency of 6.92 Mhz.

The isolated readback pulsewidth, PW-50, measured at 50% of base to peak amplitude, indicates the degree of signal distortion at a given readback frequency due to overlap between adjacent signals. Ideally, for high density recording, PW-50 should be reduced. The plot in FIG. 8A shows a significant reduction in $PW_{50}$ as film thickness is reduced from 175 to 100 Å.

Overwrite (measured in –dB) is a measure of the overbias required to completely erase a lower frequency signal with a higher frequency one. The plot in FIG. 8B shows improved overwrite properties as the thickness of the NDC film is reduced from 175 to 100 Å.

Resolution provides a measure of the response of a read/write system. Resolution is typically expressed as a ratio (in percent) between the read voltages at 2 f and 1 f, where f is as above. The plot in FIG. 8C shows improved resolution in the medium as the thickness of the NDC film is reduced from 175 to 100 Å.

From the foregoing, it will be appreciated how various objects and features of the invention are met. The sputtering of a carbon film in 20–40 atomic percent nitrogen atmosphere produces a carbon film having significantly greater resistance to wear than sputtered carbon films formed under pure inert gas, or a combination of argon and hydrogen gas. The film also shows lower stiction and friction properties.

The ability to achieve good wear resistance in a thin carbon film, e.g., 80–150 Å, leads to improved magnetic recording properties, particularly $PW_{50}$, overwrite, and resolution properties.

Although the invention has been described with respect to preferred sputtering methods, thin-film media, and methods of testing the media, it will be appreciated that various changes and modifications may be made without departing from the invention.

We claim:

1. In a thin-film medium having a substrate and a magnetic thin-film layer, a carbon overcoat which is formed on said layer by sputtering from a graphite target under an atmosphere consisting essentially of 60–80 atomic percent argon and 20–40 atomic percent nitrogen, said overcoat characterized by an erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere.

2. The medium of claim 1, wherein said overcoat has a thickness between 80–150 Å.

3. In a method of forming a carbon overcoat in a thin-film recording medium, by sputter deposition from a graphite target in an argon-containing atmosphere, a method of achieving a severalfold decrease in the erosion rate of the overcoat, as measured by an $Al_2O_3$ particle tape placed in contact with the medium, over the rate of erosion of an overcoat formed by sputtering the overcoat under a pure argon atmosphere, comprising depositing the overcoat by sputtering from a graphite target under an atmosphere consisting essentially of 60–80 atomic percent argon and 20–40 atomic percent nitrogen.

4. The method of claim 3, wherein said depositing is effective to form an overcoat having a thickness of between 80–150 Å.

5. A method of producing a carbon overcoat in a thin film medium, comprising, depositing the overcoat by sputtering from a graphite target under an atmosphere consisting essentially of 40–80 atomic percent argon and 20–40 atomic percent nitrogen, to an overcoat thickness of between 80–150 Å, said overcoat characterized by an erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere.

* * * * *